United States Patent [19]
Alm

[11] Patent Number: 6,057,741
[45] Date of Patent: May 2, 2000

[54] RADIO FREQUENCY OSCILLATOR HAVING CAPACITIVELY COUPLED VARIABLE REACTANCE DEVICE

[75] Inventor: Roberto Alm, Windham, N.H.

[73] Assignee: Raytheon Company, Lexington, Mass.

[21] Appl. No.: 08/845,748

[22] Filed: Apr. 25, 1997

[51] Int. Cl.[7] .............................. H03B 5/02; H03B 5/18
[52] U.S. Cl. .................. 331/117 D; 331/96; 331/177 V; 331/107 SL; 333/205; 333/235
[58] Field of Search ................ 331/117 V, 107 SL, 331/96, 117 D; 333/204, 205, 219, 235

[56] References Cited

U.S. PATENT DOCUMENTS

| | | | |
|---|---|---|---|
| 3,996,529 | 12/1976 | Curtice | 331/96 X |
| 4,871,983 | 10/1989 | Graycar | 331/96 |
| 5,483,206 | 1/1996 | Lohninger | 331/107 SL |

*Primary Examiner*—Arnold Kinkead
*Attorney, Agent, or Firm*—Fish & Richardson P.C.

[57] ABSTRACT

A radio frequency oscillator having: a resonant circuit; a gain element coupled in feedback relationship with the resonant circuit; and a variable reactance device, such as a varactor diode, adapted for coupling to a control signal for varying the reactance of the device. The variable reactance device is coupled to the resonant circuit with a coupling factor less than one. The resonant circuit comprises a planar microstrip transmission line structure. The varactor diode is coupled to the microstrip transmission line through a strip conductor disposed adjacent to, and dielectrically spaced from, a strip conductor of the resonant circuit. In one embodiment, the strip conductors are disposed in a side-by-side, dielectrically spaced relationship. In another embodiment, the strip conductors are disposed in a face-to-face, dielectrically spaced relationship.

18 Claims, 2 Drawing Sheets

RADIO FREQUENCY OSCILLATOR HAVING CAPACITIVELY COUPLED VARIABLE REACTANCE DEVICE

BACKGROUND OF THE INVENTION

This invention relates generally to radio frequency (RF) oscillators and more particularly to tunable RF oscillators.

As is known in the art, RF oscillator have a wide range of applications. Many of these oscillators are tunable to a particular frequency within a range of frequencies. One type of tunable RF oscillator includes a varactor diode. The varactor diode is connected to a resonant circuit, or cavity, used in the oscillator. The frequency of the RF signal produced by the oscillator is a function of the resonant frequency of the resonant circuit. The varactor diode changes its reactance in response to an applied voltage. The varactor is connected to the resonant circuit. Thus, as the applied voltage changes, the reactance of the varactor changes, and resonant frequency of the resonant circuit correspondingly changes. Hence, the frequency of the RF signal produced by the RF oscillator is tunable by the applied voltage.

SUMMARY OF THE INVENTION

In accordance with the invention, a radio frequency oscillator is provided having a resonant circuit, a gain element coupled in feedback relationship with the resonant circuit; and a variable reactance device, such as a varactor diode, adapted for coupling to a control signal for varying the reactance of the device. The variable reactance device is coupled to the resonant circuit with a coupling factor less than one.

With such an arrangement, because the varactor is not directly, i.e., not DC coupled, to the resonant circuit, the resonant circuit is not loaded by the varactor diode resulting in a higher Q resonant circuit. Further, because no DC varactor diode bias is applied to the resonant circuit, the design is simplified and phase noise performance is improved. Still, further, the indirect, i.e., less than unity coupling factor, coupling to the resonant circuit, enables the use of control signal, typically control voltage, having a relatively large level thereby improving the noise performance of the oscillator.

In preferred embodiments of the invention, the resonant circuit is a microstrip transmission line structure. The varactor diode is coupled to the strip conductor of the strip transmission line structure through a second strip conductor disposed adjacent to, and dielectrically spaced from, the first-mentioned strip conductor. In one embodiment, the second strip conductor is disposed along side a length portion of the first-mentioned strip conductor. In another embodiment, the second strip conductor is disposed over a length portion of the first-mentioned strip conductor.

BRIEF DESCRIPTION OF THE DRAWING

Other features of the invention, as well as the invention itself, will become more readily apparent from the following detailed description when taken together with the accompanying drawings, in which.

DESCRIPTION OF THE PREFERRED EMBODIMENTS

Figure 1:
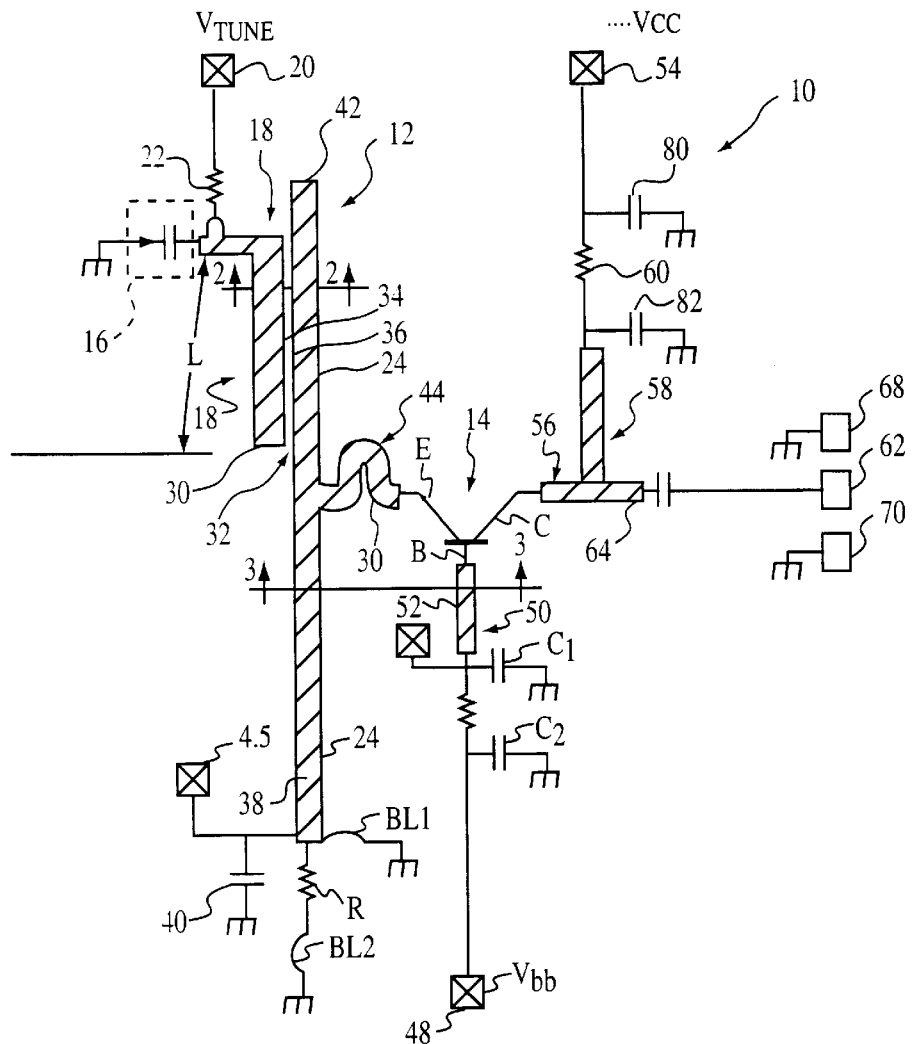
FIG. 1 is a schematic diagram of a variable oscillator in accordance with the invention.

Referring now to FIG. 1, a radio frequency oscillator 10 is shown to include: a resonant circuit 12; a gain element 14, here a heterojunction bipolar transistor (HBT) coupled in feedback relationship with the resonant circuit 12; a variable reactance device, here a varactor diode 16, adapted for coupling to a control signal, $V_{TUNE}$, and a structure 18 for coupling the varactor diode 16 to the resonant circuit 12 with a coupling factor less than unity in a manner to be described.

Here the control signal, $V_{TUNE}$, is a DC voltage applied to contact pad 20. The DC voltage at contact pad 20 is coupled to the cathode of the varactor diode 16 through resistor 22. The anode of the varactor diode 16 is connected to ground, as shown. The DC voltage, $V_{TUNE}$, has a nominal value selected to place the varactor diode 16 in a reverse biased condition. Changes in the DC voltage, $V_{TUNE}$, correspondingly change the deletion region of the reverse biased varactor diode 16 and thereby correspondingly change the capacitive reactance of diode 16.

Figure 2:
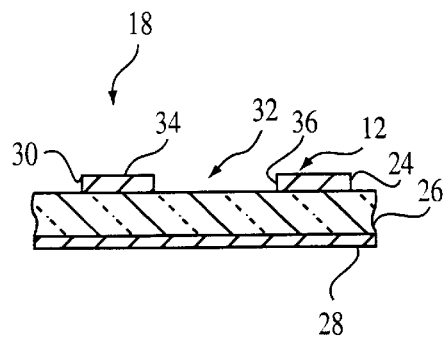
FIG. 2 is a diagrammatical cross-sectional sketch of a portion of a resonant circuit and coupling structure used in the oscillator of FIG. 1 to couple a variable reactive device in such oscillator to the resonant circuit with a coupling factor less than unity, such cross-section being taken along line 2—2 in FIG. 1.

As noted above, a structure 18 is provided for coupling the varactor diode 16 to the resonant circuit 12 with a coupling factor less than unity. More particularly, referring also to FIG. 2, the resonant circuit 12 is a microstrip transmission line structure having: a strip transmission line 24; a dielectric 26, here a gallium arsenide substrate; and a ground plane conductor 28. The resonant circuit 12 is here a planar microstrip transmission line structure. The microstrip transmission line structure, i.e., resonator 12, and the HBT 14 are formed on a single crystal substrate, here the gallium arsenide substrate 26 as a monolithic microwave integrated circuit (MMIC). The strip conductor 24 of the resonant circuit 12 is separated from the ground plane conductor 28 by the dielectric 26, as shown in FIG. 2. The coupling structure 18 includes a strip conductor 30 directly (i.e., DC connected) to the cathode of the varactor diode 16 and to the contact pad 20 via resistor 22, as shown in FIG. 1. It is noted that a portion of the strip conductor 30 of the coupling structure 18 is disposed adjacent to, and dielectrically separated from, here by air in the gap 32, the resonant circuit strip conductor 24, as shown in FIG. 2. Here the gap 32 is 5 micrometers.

More particularly, the varactor diode 16 is capacitively coupled to the resonant circuit 12 through the strip conductor 24 being disposed adjacent to, and dielectrically spaced from, the strip conductor 30, as shown in FIG. 2. The edges 34, 36 of the strip conductors 30, 24, respectively, are disposed adjacent each other for a length, L, greater than 0.1

λ, where λ is the nominal operating wavelength of the oscillator 10. That is, instead of the varactor diode 16 being directly, i.e., DC connected to the strip conductor 24 of the resonant circuit 12, a dielectric gap, here an air gap 32, (FIGS. 1 and 2) is provided between the strip conductor 24, 30.

Referring in more detail to the resonant circuit 12, it is first noted that the length of the strip conductor 24 is λ/4. One end, here end 38 of the strip conductor 20 is AC coupled to ground through a capacitor 40, as shown. The other end, here 42 of the resonant circuit 12 is an open circuit, as shown. A microstrip transmission line section 44 is used to couple the resonant circuit 12 to the emitter (E) electrode of the HBT 14. More particularly, the microstrip transmission line section 44 couples the emitter electrode (E) to approximately the mid-point of the strip conductor 24. The shape, i.e., length of microstrip transmission line section 44 is selected to match the impedance of the emitter circuit to the complex conjugate of the impedance of the resonator circuit 12. It is also noted that the strip conductor 24 of the resonant circuit 12 and the strip conductor 30 of the microstrip transmission line section 44 are used to either: (1) DC couple an emitter DC bias voltage, Vee, at contact pad 45 to the emitter electrode (E) of the HBT 14 when breakable links BL1, BL2 are both opened; (2) DC couple the emitter (E) to ground when breakable links BL1, BL2 are left, as shown, closed (i.e., short) and no voltage is applied to pad 45; or (3) DC couple the emitter (E) to ground through a resistor, R, when breakable link BL1 is open and breakable link BL2 is left closed and no voltage is applied to pad 45.

Figure 3:
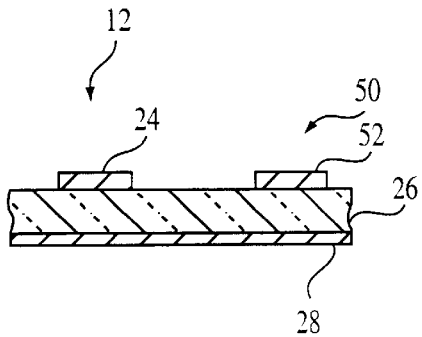
FIG. 3 is a diagrammatical cross-sectional sketch of a portion of a resonant circuit and a microstrip transmission line structure used in the oscillator of FIG. 1 to couple the resonant circuit in feedback relationship with a gain element used in the oscillator of FIG. 1, such cross-section being taken along line 3—3 in FIG. 1.

As noted above the gain element is the HBT 14. Here, the HBT 14 is connected in a common base oscillator, the base electrode (B) being AC coupled to ground through a pair of capacitors $C_1$, $C_2$, here 4 pf and DC coupled to a base bias voltage, Vbb, applied to contact pad 48. In order to make the transistor 14 "unstable", a piece of transmission line 50 having strip conductor 52 (FIG. 3), in series with the base electrode (B). More particularly, a portion of the RF energy in the resonant circuit 12 is coupled, via the ground plane 28, to the base (B) through the strip conductor 52 thereby providing the proper feedback from the resonant circuit 12 to the base circuit of the HBT 14. The collector electrode (C) of the HBT 14 is DC coupled to: a Vcc DC bias contact 54 via strip transmission line sections 56, 58, and resistor 60; and, a RF output pad 62 via strip transmission line sections 56, 64 and capacitor 66. Disposed on either side of the RF output pad 62 are a pair of grounded pads 68, 70, as shown. The total electrical length of transmission line sections 56, 58 provide a RF open circuit to RF energy at the collector electrode (C) and the total electrical length of transmission line sections 56, 64 provide an RF short circuit between the collector electrode (C) and capacitor 66. Capacitors 80, 82 are provided to short and AC component at contact 54 to ground.

Figure 4:
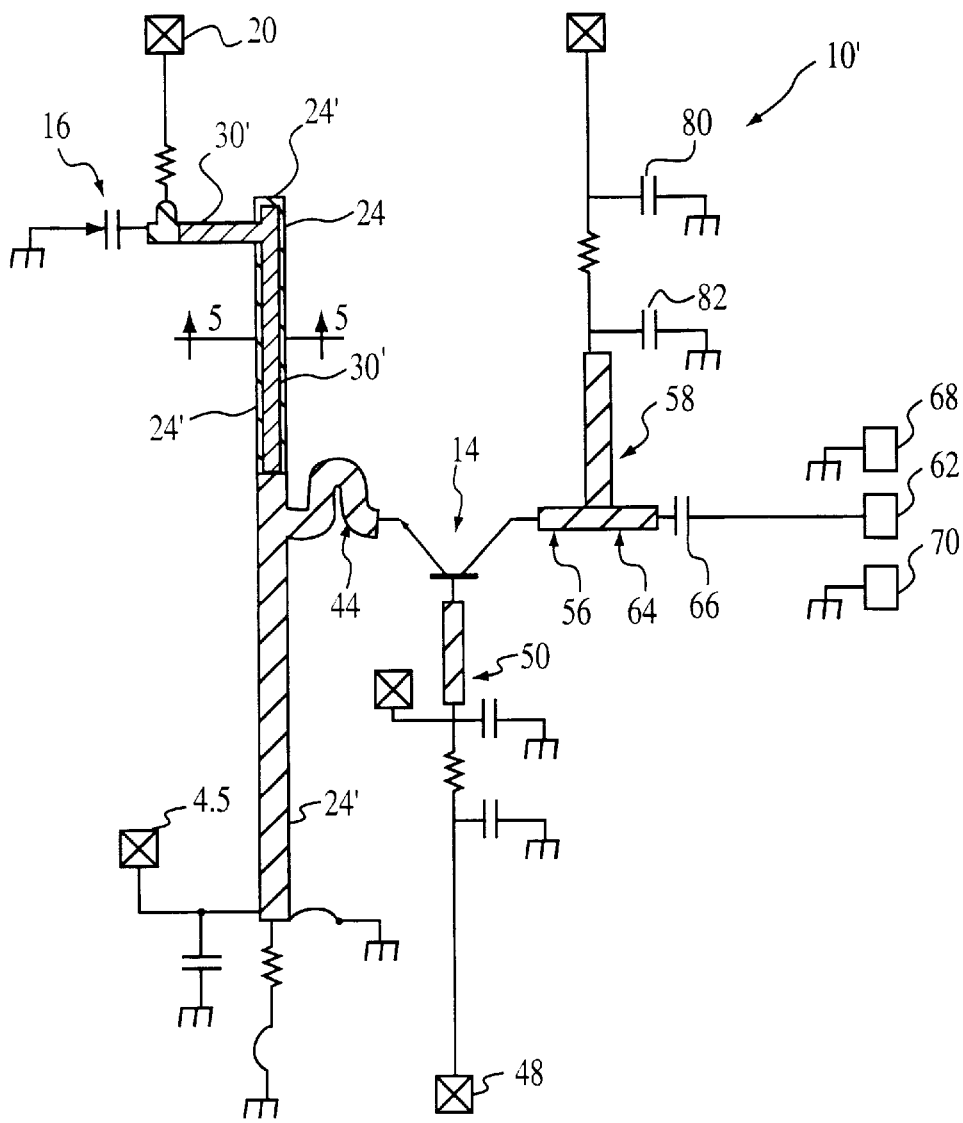
FIG. 4 is a schematic diagram of a variable oscillator in accordance with an alternative embodiment of the invention.
Figure 5:
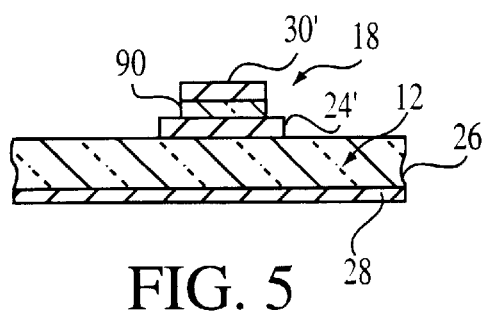
FIG. 5 is a diagrammatical cross-sectional sketch of a portion of a resonant circuit and a coupling structure used in the oscillator of FIG. 2 to couple a variable reactive device in such oscillator to the resonant circuit with a coupling factor less than unity, such cross-section being taken along line 5—5 in FIG. 4.

Referring now to FIG. 4, a variable oscillator 10' in accordance with an alternative embodiment of the invention is shown. Here, instead of using edge-to-edge coupling between the strip conductors 24, 30 used in the resonant circuit 12 and the coupling structure 18 in FIGS. 1 and 2, a face-to-face arrangement is used between the strip conductors 24', 30' as shown more clearly in FIG. 5. Thus, a dielectric layer 90, here for example, silicon nitride, is disposed and patterned over the upper face, or surface, of the strip conductor 24' used for the resonator circuit 12. The strip conductor 30' for the coupling structure 18 is the deposited and patterned as shown in FIGS. 4 and 5 to enable capacitive coupling (i.e., coupling with less than a unity coupling factor) between the varactor diode 16 and the resonant circuit 12.

Other embodiments are within the spirit and scope of the appended claims.

What is claimed is:

1. A radio frequency oscillator, comprising:
   a substrate;
   a microstrip transmission line resonant circuit comprising a first strip conductor disposed on a surface of the substrate and a ground plane conductor disposed on an opposite surface of the substrate;
   a gain element disposed on the substrate;
   a second strip conductor disposed on the surface of the substrate and coupled to the gain element and arrange to couple the gain element in a feedback relationship with the resonant circuit; and
   a variable reactance device, adapted for coupling to a control signal to vary the reactance of the device;
   a coupling structure comprising a conductor disposed on the surface of the substrate and connected to the variable reactance device, such coupling structure conductor being capacitively coupled to the first strip conductor; and
   wherein the variable reactance device is coupled to the resonant circuit with a coupling factor less than one.

2. The oscillator recited in claim 1 wherein the variable reactance device is a varactor diode.

3. The oscillator recited in claim 2 wherein the gain element comprises a transistor.

4. The oscillator recited in claim 3 wherein one end the first strip conductor is coupled to the ground plane conductor.

5. The oscillator recited in claim 3 wherein the variable reactance device is capacitively coupled to the first strip conductor through a coupling conductor, such coupling conductor being connected to the varactor and being disposed adjacent to, and dielectrically spaced from, the first strip conductor.

6. The oscillator recited in claim 5 wherein the first strip conductor is disposed in a side-by-side, dielectrically spaced, relationship with the coupling structure conductor.

7. The oscillator recited in claim 5 wherein the first strip conductor is disposed in a face-to-face, dielectrically spaced, relationship with the coupling structure conductor.

8. A radio frequency oscillator, comprising:
   a resonant circuit;
   a gain element coupled in feedback relationship with the resonant circuit;
   a variable reactance device, adapted for coupling to a control signal to vary the reactance of the device;
   wherein the variable reactance device is coupled to the resonant circuit with a coupling factor less than one;
   wherein the variable reactance device is a varactor diode;
   wherein the resonant circuit comprises a microstrip transmission line structure;
   wherein the varactor diode is capacitively coupled to the microstrip transmission line structure by a strip conductor disposed adjacent to, and dielectrically spaced from, a strip conductor of the microstrip transmission line structure;
   wherein the strip conductors are disposed in a side-by-side, dielectrically spaced, relationship; and
   wherein the strip conductors are disposed adjacent each other for a length greater than 0.1 λ, where λ is the nominal operating wavelength of the oscillator.

9. A radio frequency oscillator, comprising:

a resonant circuit;

a gain element coupled in feedback relationship with the resonant circuit;

a variable reactance device, adapted for coupling to a control signal to vary the reactance of the device;

wherein the variable reactance device is coupled to the resonant circuit with a coupling factor less than one;

wherein the variable reactance device is a varactor diode;

wherein the resonant circuit comprises a microstrip transmission line structure;

wherein the varactor diode is capacitively coupled to the microstrip transmission line structure by a strip conductor disposed adjacent to, and dielectrically spaced from, a strip conductor of the microstrip transmission line structure; and wherein the strip conductors are disposed in a face-to-face, dielectrically spaced, relationship; and wherein the strip conductors are disposed adjacent each other for a length greater than 0.1 $\lambda$, where $\lambda$ is the nominal operating wavelength of the oscillator.

10. A radio frequency oscillator, comprising:

a microwave transmission line resonant circuit comprising:

a strip conductor;

a substrate; and a ground plane conductor disposed on a first surface of the substrate, such strip conductor being disposed on a second surface of the substrate and separated from the ground plane conductor by the substrate;

a gain element coupled in feedback relationship with the resonant circuit;

a variable reactance device adapted for coupling to a control signal to vary the reactance of the variable reactance device in accordance with such control signal; and a coupling structure disposed on the second surface of the substrate for capacitively coupling the variable reactance device to the strip conductor of the resonant circuit, such coupling structure comprising a conductor disposed adjacent to, and dielectrically separated from, the strip conductor of the resonant circuit.

11. The oscillator recited in claim 10 wherein the variable reactance device is a varactor diode.

12. The oscillator recited in claim 11 wherein the resonant circuit comprises a microstrip transmission line structure.

13. The oscillator recited in claim 12 wherein one end of the microstrip transmission line structure is coupled to ground.

14. The oscillator recited in claim 10 wherein the variable reactance device is capacitively coupled to the resonant circuit.

15. The oscillator recited in claim 10 wherein the strip conductors are disposed in a side-by-side, dielectrically spaced, relationship.

16. The oscillator recited in claim 10 wherein the strip conductors are disposed in a face-to-face, dielectrically spaced relationship.

17. A radio frequency oscillator, comprising:

a microwave transmission line resonant circuit comprising:

a strip conductor;

a substrate; and a ground plane conductor disposed on a first surface of the substrate, such strip conductor being disposed on a second surface of the substrate and separated from the ground plane conductor by the substrate;

a gain element coupled in feedback relationship with the resonant circuit;

a variable reactance device adapted for coupling to a control signal to vary the reactance of the device in accordance with such control signal; and a coupling structure disposed on the second surface of the substrate for capacitively coupling the variable reactance device to the resonant circuit, such coupling structure comprising a conductor disposed adjacent to, and dielectrically separated from, the strip conductor of the resonant circuit;

wherein the strip conductor and the coupling structure conductor are disposed adjacent to, and dielectrically spaced from, each other; and wherein the strip conductors are disposed adjacent each other for a length greater than 0.1 $\lambda$, where $\lambda$ is the nominal operating wavelength of the oscillator.

18. A radio frequency oscillator, comprising:

a microwave transmission line resonant circuit comprising:

a strip conductor;

a substrate; and a ground plane conductor disposed on a first surface of the substrate, such strip conductor being disposed on a second surface of the substrate and separated from the ground plane conductor by the substrate;

a gain element coupled in feedback relationship with the resonant circuit;

a variable reactance device adapted for coupling to a control signal to vary the reactance of the device in accordance with such control signal; and a coupling structure disposed on the second surface of the substrate for capacitively coupling the variable reactance device to the resonant circuit, such coupling structure comprising a conductor disposed adjacent to, and dielectrically separated from, the strip conductor of the resonant circuit;

wherein the strip conductor and the coupling structure conductor are disposed adjacent to, and dielectrically spaced from, each other; and wherein the strip conductors are disposed adjacent each other for a length greater than 0.1 $\lambda$, where $\lambda$ is the nominal operating wavelength of the oscillator.

* * * * *